(12) United States Patent
Shimizu et al.

(10) Patent No.: US 11,591,688 B2
(45) Date of Patent: Feb. 28, 2023

(54) SPUTTERING TARGET, GRANULAR FILM AND PERPENDICULAR MAGNETIC RECORDING MEDIUM

(71) Applicant: JX Nippon Mining & Metals Corporation, Tokyo (JP)

(72) Inventors: Masayoshi Shimizu, Ibaraki (JP); Manami Masuda, Ibaraki (JP); Yasuyuki Iwabuchi, Ibaraki (JP); Takashi Kosho, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 16/973,074

(22) PCT Filed: May 23, 2019

(86) PCT No.: PCT/JP2019/020554
§ 371 (c)(1),
(2) Date: Dec. 8, 2020

(87) PCT Pub. No.: WO2020/031459
PCT Pub. Date: Feb. 13, 2020

(65) Prior Publication Data
US 2021/0246543 A1 Aug. 12, 2021

(30) Foreign Application Priority Data
Aug. 9, 2018 (JP) .............................. JP2018-150677

(51) Int. Cl.
*H01J 37/34* (2006.01)
*C23C 14/34* (2006.01)
*G11B 5/733* (2006.01)
*G11B 5/84* (2006.01)

(52) U.S. Cl.
CPC ........ *C23C 14/3414* (2013.01); *G11B 5/7334* (2019.05); *G11B 5/8404* (2013.01); *H01J 37/3426* (2013.01)

(58) Field of Classification Search
None
See application file for complete search history.

(56) References Cited

U.S. PATENT DOCUMENTS

| 2006/0071197 | A1 | 4/2006 | Suzuki |
| 2008/0131735 | A1 | 6/2008 | Das et al. |
| 2008/0166596 | A1* | 7/2008 | Das ........................ C22C 1/06 428/800 |
| 2008/0180839 | A1 | 7/2008 | Mochizuki et al. |
| 2012/0028077 | A1 | 2/2012 | Watanabe |
| 2012/0164488 | A1 | 6/2012 | Shin et al. |
| 2015/0132606 | A1 | 5/2015 | Kurokawa et al. |
| 2018/0019109 | A1* | 1/2018 | Sugawara .............. G11B 7/243 |
| 2020/0105297 | A1 | 4/2020 | Tham et al. |
| 2020/0216945 | A1 | 7/2020 | Sato |

FOREIGN PATENT DOCUMENTS

| CN | 101276599 A | 10/2008 |
| JP | 2000-247739 A | 9/2000 |
| JP | 2004-068073 A | 3/2004 |
| JP | 2008-176858 A | 7/2008 |
| JP | 2011-123959 A | 6/2011 |
| JP | 2012-009086 A | 1/2012 |
| JP | 2012-053969 A | 3/2012 |
| TW | 201443261 A | 11/2014 |
| WO | WO-2013/183277 A1 | 12/2013 |
| WO | WO-2014/141737 A1 | 9/2014 |
| WO | WO-2018/047978 A1 | 3/2018 |
| WO | WO-2018/083951 A1 | 5/2018 |

OTHER PUBLICATIONS

Search Report in International Application No. PCT/JP2019/020554 dated Aug. 13, 2019, 4 pages.
International Preliminary Report on Patentability and Written Opinion in International Application No. PCT/JP2019/020554 dated Feb. 18, 2021, 5 pages.
Office Action in CN Application No. 201980003870.5 dated Jun. 3, 2021, 19 pages.

* cited by examiner

*Primary Examiner* — Jason Berman
(74) *Attorney, Agent, or Firm* — Marshall, Gerstein & Borun LLP

(57) ABSTRACT

Provided is a sputtering target containing 0.05 at % or more of Bi, and having a total content of metal oxides of from 10 vol % to 70 vol %, the balance containing at least Ru.

20 Claims, No Drawings

SPUTTERING TARGET, GRANULAR FILM AND PERPENDICULAR MAGNETIC RECORDING MEDIUM

TECHNICAL FIELD

This specification discloses arts relating to a sputtering target, a granular film, and a perpendicular magnetic recording medium.

BACKGROUND ART

A magnetic recording medium such as a perpendicular magnetic recording medium that records magnetism in a direction perpendicular to a recording surface may be formed of a plurality of layers comprised of a recording layer including an upper recording layer and a lower recording layer, and other layers. Each of these layers is sputtered on a substrate using a sputtering target corresponding to each layer to form each film sequentially, in which a sputtering target having metal phases comprised of metals mainly based on Co and oxide phases containing a certain metal oxide may be used. Examples of such a sputtering target include those described in Patent Documents 1 to 4.

Here, a recent recording layer employs a so-called ECC (Exchange-Coupled Composite) medium in which a ferromagnetic oxide layer based on Co and containing an oxide and an exchange-coupled control layer using a granular film based on Co and Ru or based on Ru and containing an oxide are alternately formed. In order to improve separation between magnetic particles in the recording layer, an onset layer of a granular film which is nonmagnetic, based on Co and Ru or Ru and contains an oxide is also used between an intermediate layer based on Ru and a lowermost portion of the recording layer using a ferromagnetic layer based on Co and containing an oxide. Such layers are described in Patent Documents 1 to 4, for example. The granular film used for these exchange coupled control layer and onset layer requires characteristics of promoting higher crystal orientation of the magnetic particles in the ferromagnetic oxide layer formed on an upper portion of the granular layer and good separation between the magnetic particles.

As used herein, the ferromagnetic oxide layer refers to a layer having a saturation magnetization of about 400 emu/cc or more at room temperature, and the exchange coupled control layer and the onset layer refer to layers having a saturation magnetization of about 300 emu/cc or less at room temperature (see Patent Document 3).

Such layers are generally formed by a sputtering target obtained by further adding a metal oxide such as $SiO_2$, $TiO_2$ and $B_2O_3$ to a material based Co and Ru or Ru and containing a non-magnetic metal such as Pt and Cr, in order to provide improved magnetic orientation of the CoPt magnetic grains in the ferromagnetic oxide layer formed on the upper portion while making it non-magnetic. Also, a recording layer capable of maintaining high-density recording bits is formed by simultaneously sputtering metal oxides such as $SiO_2$, $TiO_2$, and $B_2O_3$ and filling magnetic inter-particles with the sputtering metal oxides to form a so-called granular structure, thereby weakening exchange coupling between the magnetic particles.

CITATION LIST

Patent Literatures

Patent Document 1: Japanese Patent Application Publication No. 2012-009086 A

Patent Document 2: Japanese Patent Application Publication No. 2012-053969 A

Patent Document 3: Japanese Patent Application Publication No. 2008-176858 A

Patent Document 4: Japanese Patent Application Publication No. 2011-123959 A

SUMMARY OF INVENTION

Technical Problem

However, the sputtering target obtained by adding the metal oxide such as $SiO_2$, $TiO_2$, and $B_2O_3$ to Co or Ru as described above results in insufficient separateness of magnetic particles to further improve the recording density. Therefore, there would be still room for improving this type of sputtering target.

To solve the above problems, this disclosure proposes a sputtering target, a granular film, and a perpendicular magnetic recording medium, which can improve crystal orientation of magnetic particles and separateness of the magnetic particles

Solution to Problem

A sputtering target disclosed herein contains 0.05 at % or more of Bi, and has a total content of metal oxides of from 10 vol % to 70 vol %, the balance containing at least Ru.

A granular film disclosed herein contains 0.05 at % or more of Bi and has a total content of metal oxides of from 10 vol % to 70 vol %, the balance containing at least Ru.

A perpendicular magnetic recording medium disclosed herein comprises the above granular film.

Advantageous Effects of Invention

According to the granular film and the perpendicular magnetic recording medium produced using the above sputtering target, it is possible to suppress particle growth of the magnetic particles and improve a particle size dispersion of the magnetic particles and separateness between the magnetic particles, while maintaining crystal orientation of the magnetic particles.

DESCRIPTION OF THE PREFERRED EMBODIMENTS

Hereinafter, embodiments of the sputtering target, granular film and perpendicular magnetic recording medium as described above will be described in detail.

A sputtering target according to one embodiment contains 0.05 at % or more of Bi, and has a total content of metal oxides of from 10 vol % to 70 vol %, the balance containing at least Ru. By performing sputtering using such a sputtering target containing Bi, separation of magnetic particles in a film formed on an upper portion of the film formed by the sputtering can be improved while maintaining crystal orientation.

(Composition of Sputtering Target)

Metal components of the sputtering target mainly contain Co and Ru or Ru, and it is important to contain Bi in addition to those components. By containing Bi, the growth of metal particles can be suppressed. This can provide smaller magnetic particles in the recording layer formed on the upper portion. In particular, when the film is formed at a high substrate temperature in order to improve the crystallinity, the size of the metal particles is not increased, and both the smaller particle diameter and the crystallinity can be achieved. Furthermore, it is possible not only to easily segregate the metal oxide at grain boundaries, but also to form a film with less dispersion of a grain boundary width. This can allow fine metal particles having uniform particle diameter dispersion to be dispersed via oxide grain boundaries having a uniform width. As a result, the particle diameter dispersion of the magnetic particles in the recording layer formed on the upper portion can be reduced, and a recording layer having oxide grain boundaries with a uniform width can be formed.

This would be because melting points of Bi and Bi oxide itself are lower, as well as the Bi oxide can be bonded to other main oxides to lower the melting point, and Bi and Co or Ru are difficult to form an alloy, while they have better wettability between Co or Ru and Bi oxide. In general, it is believed that, as a cause of an increase in particle diameter dispersion, the metal oxide having a higher melting point first solidifies to prevent the growth of magnetic particles based on Co and Ru. However, it can be expected that, by lowering the melting point of the metal oxide, the metal oxide easily moves and the growth of the particles is not hindered, so that the dispersion of the particle size can be reduced. Further, it can be expected that the better wettability between Bi oxide and Co or Ru suppress rounded magnetic particles surrounded by the oxide, resulting in a film with an oxide having a uniform width formed around polygonal magnetic particles.

The above matters can be considered, but they are not limited to such theories.

The Bi content is 0.05 at % or more in Bi equivalent. Bi may be contained as a metal component and/or an oxide component, but when it is contained as both the metal component and the oxide component, the above content means the sum of Bi elements in those components.

When the Bi content is less than 0.05 at %, the improvement of space separateness between the metal particles is not sufficient. On the other hand, if the Bi content is too high, the hcp structure of the metal particles may be unstable. Therefore, the Bi content is preferably 0.5 at % or more, for example, from 0.5 at % to 10 at %.

For the above effect of adding Bi, it is preferable that a part or all of Bi is contained as a metal oxide.

The sputtering target contains at least Ru as a metal component. It can further contain Co. This is to obtain metal particles having the same hcp crystal structure as that of CoPt formed on the upper portion. It should be note that Co may not be contained in some cases.

The metal components of the sputtering target can contain the above Bi and Ru for optimizing both a crystal lattice constant and wettability between the magnetic grains and oxide grain boundaries forming the upper layer, as well as in addition to Co, optionally, at least one selected from the group consisting of Pt, Au, Ag, B, Cu, Cr, Ge, Ir, Mn, Mo, Nb, Ni, Pd, Re, Rh, Ta, W, and V in the total amount of from 0.5 at % to 30 at %, as needed.

The sputtering target generally contains the metals and metal oxides as described above. The total content of the metal oxides is from 10 vol % to 70 vol % in volume fraction. The total content of metal oxides can be from 1 mol % to 30 mol %. When a film formed using the sputtering target is formed on a film having an hcp structure such as Ru, a granular structure is obtained, in which a metal oxide is dispersed in the above metals. If the amount of metal oxide is too low, the separation of metal particles is insufficient, and the magnetic cluster size of a recording layer produced using this may increase. On the other hand, if the amount of metal oxide is too high, the proportion of metal particles is lower and the crystallinity of the magnetic particles formed on the upper portion is decreased, so that the magnetic particles formed on the upper portion cannot obtain sufficient saturation magnetization and magnetic anisotropy, which may result in insufficient reproduction signal intensity and thermal stability.

The oxide volume fraction can be determined by calculation from density and molecular weight of each component contained in the sputtering target, but can also be determined from an area ratio of the oxide phases at any cut plane of the sputtering target. In this case, the volume ratio of the oxide phases in the sputtering target can be the area ratio at the cut surface.

Specific examples of the metal oxides include oxides of Co, Cr, Si, Ti, B, and Ta. Therefore, the sputtering target may contain an oxide of at least one element selected from the group consisting of Co, Cr, Si, Ti, B, and Ta. Examples of such metal oxides include $SiO_2$, $TiO_2$, and $B_2O_3$.

In particular, when a Ti oxide is contained, the separateness of metal particles is improved. Therefore, the sputtering target preferably contains the Ti oxide such as $TiO_2$.

Further, since the oxides of Si and B can amorphize the oxide layer and contribute to the formation of grain boundaries along the uniform width and the shape of the metal particles, the sputtering target preferably contains an oxide of either $SiO_2$ or $B_2O_3$.

Furthermore, Bi may be present in the target in the form of an oxide. That is, the metal oxide may contain Bi. The Bi oxide can be expected to form a composite oxide with other metal oxides to lower the melting point and improve the sinterability of the target. Moreover, it can be expected to facilitate segregation of the oxide to the particle diameter even in the state of the sputtered film. Further, in order to maintain a part or all of Bi in stable state as an oxide, it is preferable to contain a Co oxide.

(Method for Producing Sputtering Target)

The above sputtering target can be produced such as by a powder sintering method, and specific examples of the production method are described below.

First, as metal powder, Bi powder, Ru powder and optionally Co powder, and optionally further powder of one or more selected from the group consisting of Pt, Au, Ag, B, Cu, Cr, Ge, Ir, Mn, Mo, Nb, Ni, Pd, Re, Rh, Ta, W and V, are prepared.

The metal powder may be powder of not only a single element but also an alloy. The particle diameter of the metal power is preferably in a range of from 1 μm to 150 μm, in terms of enabling homogeneous mixing to prevent segregation and coarse crystallization. If the particle diameter of the metal powder is more than 150 μm, oxide particles as described below may not be uniformly dispersed, and if it is less than 1 μm, the sputtering target may deviate from the desired composition due to the oxidation of the metal powder.

Further, as the oxide powder, for example, $TiO_2$ powder, $SiO_2$ powder, $Bi_2O_3$ and/or $B_2O_3$ powder are prepared. The oxide powder preferably has a particle diameter in a range of from 1 μm to 30 μm. This can lead to more uniform dispersion of the oxide particles in the metal phase when the oxide powder is mixed with the metal powder, and sintered under pressure. If the particle diameter of the oxide powder is more than 30 μm, coarse oxide particles may be formed after firing under pressure. On the other hand, if it is less than 1 μm, agglomeration of the oxide powders may occur.

The above metal powder and oxide powder are then weighed so as to provide a desired composition, and mixed and pulverized using a known method such as a ball mill. In this case, it is desirable to fill the inside of a container used for the mixing/pulverizing with an inert gas to suppress the oxidation of the raw material powder as much as possible. This can provide mixed powder in which the defined metal powder and oxide powder are uniformly mixed.

The mixed powder thus obtained is then sintered under pressure in a vacuum atmosphere or an inert gas atmosphere, and formed into a predetermined shape such as a disk shape. Herein, various pressure sintering methods can be employed such as a hot press sintering method, a hot hydrostatic sintering method, a plasma discharge sintering method and the like. Among them, the hot hydrostatic sintering method is effective in terms of improvement of density of a sintered body.

A retention temperature during the sintering is in a temperature range of from 600 to 1500° C., and more preferably from 700° C. to 1400° C. A time for maintaining the temperature in this range is preferably 1 hour or more.

A pressing pressure during the sintering is preferably 10 MPa or more, and more preferably 20 MPa or more.

This can allow the oxide particles to be more uniformly dispersed in the metal phase.

The sintered body obtained by the above pressure sintering can be subjected to cutting or other machining for forming a desired shape using a lathe or the like, to produce a a sputtering target in the form of a disc or the like.

(Granular Film)

A granular film having a structure of a nonmagnetic oxide layer can be formed by performing sputtering with a sputtering apparatus, generally a magnetron sputtering apparatus, using the sputtering target as described above.

The granular film that will form such a nonmagnetic oxide layer has substantially the same composition as that of the above sputtering target.

More particularly, the granular film is a so-called granular film which contains 0.05 at % or more, preferably 0.5 at % or more of Bi, and also contains a metal oxide around a large number of metal particles based on Co and Ru or Ru, in an amount of from 10 vol % to 70 vol % in total. The total content of metal oxides in the granular film may be from 1 mol % to 30 mol %. The amount of Bi added can be adjusted to obtain a desired value. An increase in the amount of Bi added decreases the crystallinity of the metal particles, although this also depends on amounts of other nonmagnetic metals and oxides. Therefore, it is difficult to generally specify the maximum amount of Bi added. However, when about 10 at % of Bi is added, a crystal having an hcp structure based on Co and Ru may be degraded. Therefore, the Bi content in the magnetic film can be from 0.5 at % to 10 at %, for example. A part or all of Bi may be contained as an oxide. The granular film refers to a film having a structure in which metal particles are dispersed and a metal oxide is filled between the metal particles.

The metal oxide in the granular film may include an oxide of at least one element selected from the group consisting of Co, Cr, Si, Ti, B, and Ta. Among these, the metal oxide preferably includes oxides of Ti, Si, and B. The total content of the metal oxides is from 10 vol % to 70 vol %.

The granular film may further contain one or more selected from the group consisting of Pt, Au, Ag, B, Cu, Cr, Ge, Ir, Mn, Mo, Nb, Ni, Pd, Re, Rh, Ta, W, and V in the total amount of from 0.5 at % to 30 at %.

Such a granular film can be used for various applications. For example, the granular film can be suitably used as a part of an intermediate layer and recording layer of an underlying layer, intermediate layer and protective layer such as adhesive layers, soft magnetic layers, seed layers, and Ru layers on a substrate forming a perpendicular magnetic recording type magnetic recording medium (i.e., a perpendicular magnetic recording medium). In particular, the granular film can play a role in helping improvement of both magnetic anisotropy of the ferromagnetic layer and separateness of the magnetic particles by using the film on a lower portion of a ferromagnetic layer that will serve as the recording medium in the recording layer. Specifically, the granular film is suitably used for an onset layer intended to improve magnetic particle separateness of the lowermost ferromagnetic layer provided between the intermediate layer and the recording layer, or for an exchange coupled control layer used to adjust the interlayer magnetic coupling between ferromagnetic layers forming the recording layer. The granular film forming such layers preferably has a saturation magnetization of 300 emu/cc or less. It should be noted that the ferromagnetic layer generally has a saturation magnetization of about 400 emu/cc or more at room temperature.

(Perpendicular Magnetic Recording Medium)

In contrast to the conventional horizontal magnetic recording method in which magnetism is recorded in the horizontal direction with respect to the recording surface, the perpendicular magnetic recording medium records magnetism in a direction perpendicular to the recording surface. Therefore, the perpendicular magnetic recording medium can allow higher density recording, so that it is widely employed for hard disk drives and the like. Specifically, the perpendicular magnetic recording type magnetic recording medium is formed by sequentially laminating an underlying layer, an intermediate layer, a recording layer and a recording layer, and the like, such as, for example, an adhesion layer, a soft magnetic layer, a seed layer and a Ru layer, on a substrate such as aluminum and glass. Among these, the sputtering target as described above is suitable for forming an onset layer provided at the lowermost portion of the recording layer. Further, the recording layer can form a so-called ECC medium structure in which a plurality of ferromagnetic oxide layers and nonmagnetic oxide layers are alternately laminated. In this case, the sputtering target as described above is also suitable for forming a nonmagnetic oxide layer forming the ferromagnetic oxide interlayer.

Examples

Next, the sputtering targets according to present invention were experimentally produced and their performance was confirmed as described below. However, the description herein is merely for the purpose of illustration and is not intended to be limited thereto.

As Examples, sputtering targets of Ru—(Co—Pt—)Bi-oxide and sputtering targets of Ru—(Co—Pt—)$Bi_2O_3$-oxide were produced, and as Comparative Examples, sputtering targets of Ru—(Co—Pt-)oxide were produced. Table 1 shows the composition of each sputtering target.

TABLE 1

|  | Composition (mol%) | Average Particle Diameter (nm) | Particle Diameter Dispersion (%) | Saturation Magnetization (emu/cc) | Magnetic Anisotropy (Merg/cc) | Coercivity (kOe) |
|---|---|---|---|---|---|---|
| Example 1 | Co-20Pt-40Ru-1Bi-18TiO2 | 7.9 | 17.5 | 750 | 6.5 | 4.3 |
| Example 2 | Co-20Pt-40Ru-0.05Bi-18TiO2 | 8.0 | 17.8 | 752 | 6.4 | 4.4 |
| Example 3 | Co-20Pt-40Ru-0.5Bi-18TiO2 | 7.9 | 17.6 | 751 | 6.6 | 4.3 |
| Example 4 | Co-20Pt-40Ru-4Bi-18TiO2 | 7.8 | 17.3 | 753 | 6.5 | 4.4 |
| Example 5 | Ru-4Bi-20TiO2 | 7.9 | 17.9 | 752 | 6.4 | 4.5 |
| Example 6 | Co-40Ru-1Bi-18TiO2 | 7.8 | 17.5 | 751 | 6.5 | 4.4 |
| Example 7 | Co-40Ru-1Bi-15TiO2-10CoO | 7.7 | 17.6 | 752 | 6.5 | 4.4 |
| Example 8 | Co-20Pt-40Ru-15TiO2-1Bi2O3 | 7.8 | 17.3 | 751 | 6.6 | 4.3 |
| Example 9 | Co-20Pt-40Ru-15TiO2-5Bi2O3 | 7.7 | 17.4 | 751 | 6.5 | 4.5 |
| Example 10 | Co-20Pt-40Ru-1Bi-15TiO2-3Bi2O3 | 7.9 | 17.6 | 752 | 6.4 | 4.4 |
| Example 11 | Co-20Pt-40Ru-7TiO2-5SiO2-3Bi2O3 | 7.8 | 17.4 | 751 | 6.6 | 4.5 |
| Example 12 | Co-20Pt-40Ru-4TiO2-4SiO2-2B2O3-3Bi2O3 | 7.8 | 17.6 | 752 | 6.6 | 4.4 |
| Example 13 | Ru-17TiO2-1Bi2O3 | 7.8 | 17.8 | 750 | 6.5 | 4.3 |
| Comparative Example 1 | Co-20Pt-40Ru-18TiO2 | 8.2 | 18.5 | 751 | 6.2 | 4.3 |
| Comparative Example 2 | Ru-20TiO2 | 8.1 | 19.0 | 752 | 6.1 | 4.4 |
| Comparative Example 3 | Co-40Ru-18TiO2 | 8.3 | 18.2 | 751 | 6.2 | 4.5 |
| Comparative Example 4 | Co-40Ru-15TiO2-10CoO | 8.1 | 18.0 | 751 | 6.2 | 4.4 |
| Comparative Example 5 | Co-20Pt-40Ru-10TiO2-5SiO2 | 8.2 | 18.5 | 752 | 6.2 | 4.3 |
| Comparative Example 6 | Co-20Pt-40Ru-5TiO2-5SiO2-3B2O3 | 8.3 | 18.5 | 751 | 6.2 | 4.4 |
| Comparative Example 7 | Non | 9.2 | 18.5 | 765 | 6.3 | 4.9 |

The specific method for producing those sputtering targets will be described in detail. First, certain metal powder and metal oxide powder were weighed, sealed in a 10 liter ball mill pot together with zirconia balls as grinding media and mixed by rotating it for 24 hours. The mixed powder removed from the ball mill was filled into a carbon cylindrical mold having a diameter of 190 mm and sintered by hot pressing. The hot pressing conditions were a vacuum atmosphere, a heating rate of 300° C./hour, a retention temperature of 1000° C., and a retention time of 2 hours. A pressure of 30 MPa was applied from the start of heating to the end of retention. After the end of retention, it was naturally cooled as it is in the chamber. The sintered body thus obtained was cut to obtain a sputtering target.

As a raw material, Bi metal powder was used in Examples 1 to 7, and Bi oxide powder was used in Examples 8 to 13, respectively.

Cr—Ti (6 nm), Ni—W (5 nm), and Ru (20 nm) were deposited in this order onto a glass substrate by a magnetron sputtering apparatus (C-3010 from CANON ANELVA CORPORATION). For the resulting film, each sputtering target was sputtered at 300 W in an Ar atmosphere at 3.0 Pa to form a granular film having a thickness of 1 nm, onto which a magnetic film of Co-20Pt-3TiO$_2$-3SiO$_2$-3B$_2$O$_3$ having a thickness of 11 nm was then deposited as a ferromagnetic layer and Ru (3 nm) was then deposited as a protective film in order to prevent oxidation to form each layer. In Comparative Example 7, a ferromagnetic layer was formed directly on the Ru.

For each sample thus obtained, a saturation magnetization Ms, a coercivity Hc, and a magnetic anisotropy Ku were measured. In addition, measuring devices used for the measurement were a sample vibration type magnetometer (VSM) and a magnetic torque meter (TRQ) from TAMAGAWA CO., LTD. Here, the saturation magnetization Ms means a saturation magnetization of the entire sample produced by laminating a plurality of layers including the ferromagnetic layer as described above, and is not a saturation magnetization of the granular film alone.

It is found that the samples of Examples 1 to 13 can exhibit higher magnetic anisotropy than that of each sample of Comparative Examples 1 to 7. It shows that the crystallinity of the magnetic particles of the ferromagnetic layer was improved by providing the layers of Examples. Further, the samples of Examples had a little change of the saturation magnetization and the coercivity in spite of the higher magnetic anisotropy that that of each of Comparative Examples 1 to 6, indicating that the size of the magnetic particles in the ferromagnetic layer is smaller and the separateness is improved.

An average particle diameter and particle diameter dispersion of the magnetic particles were then determined from a TEM image obtained by energy dispersive X-ray spectroscopy (TEM-EDX) using a transmission electron microscope from JEOL Ltd. As can be seen from Table 1, in a case where Bi is added, the magnetic particle diameter tends to be smaller and the particle size dispersion tends to be generally smaller than a case where Bi is not added. In general, a decreased particle size of the magnetic particles increases the particle diameter dispersion and increases the number of smaller particles with poor crystallinity, thereby decreasing the magnetic anisotropy. However, in Examples 1 to 13, because of the addition of Bi, the particle diameter of the magnetic particles is smaller, while the particle diameter dispersion is lower and the magnetic anisotropy is higher than that of Comparative Examples. Therefore, in Examples 1 to 13, it is believed that the crystallinity of the metal particles of the nonmagnetic film is improved while improving the separateness, thereby maintaining or improving the magnetic properties of the upper ferromagnetic layer.

In view of the foregoing, it was found that according to the sputtering targets of Examples 1 to 13, the growth of the metal particles in the nonmagnetic oxide layer is suppressed, and the segregation of the metal oxide to the grain boundaries is made uniform, so that a film having a small particle diameter and less particle diameter dispersion can be formed, whereby the growth of the magnetic particles of the ferromagnetic layer formed thereon can be suppressed to form a film having a less particle diameter dispersion. As a result, it is found that a ferromagnetic layer having a smaller average particle diameter and higher magnetic anisotropy can be produced, and further the particle diameter dispersion can be lower and the separateness between the particles can be improved.

What is claimed is:

1. A sputtering target, the sputtering target containing: 0.05 at % or more of Bi; at least one element selected from an element group; and at least one oxide selected from an oxide group, the balance containing Ru, wherein:
    a total content of the at least one oxide is from 10 vol % to 70 vol %,
    the element group consists of: B, as a metalloid element; and Pt, Au, Ag, Cu, Cr, Ge, Ir, Mn, Mo, Nb, Ni, Pd, Re, Rh, Ta, W, and V as metal elements,
    the oxide group consists of oxides of Si and B as metalloid elements; and Bi, Co, Cr, Ti, and Ta as metal elements, and
    metal elements accounting for 0.05 at % or more of the sputtering target are only Bi and at least one metal element selected from a group of Pt, Au, Ag, Cu, Cr, Ge, Ir, Mn, Mo, Nb, Ni, Pd, Re, Rh, Ta, W, V, Co, Ti, and Ru.

2. The sputtering target according to claim 1, wherein the balance further contains Co.

3. The sputtering target according to claim 1, wherein the sputtering target contains a part or all of Bi as an oxide.

4. The sputtering target according to claim 1, wherein the sputtering target contains 0.5 at % or more of Bi.

5. The sputtering target according to claim 1, wherein the sputtering target contains from 0.5 at % to 30 at % of at least one selected from the group consisting of Pt, Au, Ag, B, Cu, Cr, Ge, Ir, Mn, Mo, Nb, Ni, Pd, Re, Rh, Ta, W, and V.

6. A granular film, the granular film containing: 0.05 at % or more of Bi; at least one element selected from an element group; and at least one oxide selected from an oxide group, the balance containing Ru, wherein:
    a total content of the at least one oxide is from 10 vol % to 70 vol %,
    the element group consists of: B as a metalloid element; and Pt, Au, Ag, Cu, Cr, Ge, Ir, Mn, Mo, Nb, Ni, Pd, Re, Rh, Ta, W, and V as metal elements,
    the oxide group consists of oxides of Si and B as metalloid elements; and Bi, Co, Cr, Ti, and Ta as metal elements, and
    metal elements accounting for 0.05 at % or more of the sputtering target are only Bi and at least one metal element selected from a group of Pt, Au, Ag, Cu, Cr, Ge, Ir, Mn, Mo, Nb, Ni, Pd, Re, Rh, Ta, W, V, Co, Ti, and Ru.

7. The granular film according to claim 6, wherein the balance further contains Co.

8. The granular film according to claim 6, wherein the granular film contains a part or all of Bi as an oxide.

9. The granular film according to claim 6, wherein the granular film contains 0.5 at % or more of Bi.

10. The granular film according to 7, wherein the granular film contains from 0.5 at % to 30 at % of at least one selected from the group consisting of Pt, Au, Ag, B, Cu, Cr, Ge, Ir, Mn, Mo, Nb, Ni, Pd, Re, Rh, Ta, W, and V.

11. A perpendicular magnetic recording medium comprising the granular film according to claim 6.

12. A sputtering target, the sputtering target containing: 0.05 at % or more of Bi; and at least one oxide selected from an oxide group, the balance containing Ru, wherein:
    a total content of the least one oxide is from 10 vol % to 70 vol %,
    the oxide group consists of oxides of: Si and B as metalloid elements; and Bi, Co, Cr, Ti, and Ta as metal elements, and
    metal elements accounting for 0.05 at % or more of the sputtering target are only Bi and at least one metal element selected from a group of Co, Cr, Ti, Ta, and Ru.

13. The sputtering target according to claim 12, wherein the balance further contains Co.

14. The sputtering target according to claim 12, wherein the sputtering target contains a part or all of Bi as an oxide.

15. The sputtering target according to claim 12, wherein the sputtering target contains 0.5 at % or more of Bi.

16. A granular film, the granular film containing: 0.05 at % or more of Bi; and at least one oxide selected from an oxide group, the balance containing Ru, wherein:
    a total content of the least one oxide is from 10 vol % to 70 vol %,
    the oxide group consists of oxides of: Si and B as metalloid elements; and Bi, Co, Cr, Ti, and Ta as metal elements, and
    metal elements accounting for 0.05 at % or more of the sputtering target are only Bi and at least one metal element selected from a group of Co, Cr, Ti, Ta and Ru.

17. The granular film according to claim 16, wherein the balance further contains Co.

18. The granular film according to claim 16, wherein the granular film contains a part or all of Bi as an oxide.

19. The granular film according to claim 16, wherein the granular film contains 0.5 at % or more of Bi.

20. A perpendicular magnetic recording medium comprising the granular film according to claim 16.

* * * * *

UNITED STATES PATENT AND TRADEMARK OFFICE
CERTIFICATE OF CORRECTION

| | | |
|---|---|---|
| PATENT NO. | : 11,591,688 B2 | |
| APPLICATION NO. | : 16/973074 | |
| DATED | : February 28, 2023 | |
| INVENTOR(S) | : Shimizu et al. | |

It is certified that error appears in the above-identified patent and that said Letters Patent is hereby corrected as shown below:

In the Claims

At Column 10, Line 5, "according to 7," should be -- according to claim 6, --.

Signed and Sealed this
Nineteenth Day of November, 2024

Katherine Kelly Vidal
*Director of the United States Patent and Trademark Office*